United States Patent [19]

Anthony et al.

[11] 4,010,534
[45] Mar. 8, 1977

[54] PROCESS FOR MAKING A DEEP DIODE ATOMIC BATTERY

[75] Inventors: Thomas R. Anthony; Harvey E. Cline, both of Schenectady, N.Y.

[73] Assignee: General Electric Company, Schenectady, N.Y.

[22] Filed: June 27, 1975

[21] Appl. No.: 590,876

[52] U.S. Cl. .............................. 29/572; 29/576 R; 29/577; 29/580; 148/171
[51] Int. Cl.² .......................................... B01J 17/00
[58] Field of Search ............ 29/577, 572, 576, 580; 148/171

[56] References Cited
UNITED STATES PATENTS

| | | |
|---|---|---|
| 2,813,048 | 11/1957 | Pfann ................................. 148/171 |
| 3,038,085 | 6/1962 | Wallmark ............................. 29/580 |
| 3,419,955 | 1/1969 | Schutze ............................... 29/580 |
| 3,764,409 | 10/1973 | Nomura ............................... 29/580 |

*Primary Examiner*—W. Tupman
*Attorney, Agent, or Firm*—Donald M. Winegar; Joseph T. Cohen; Jerome C. Squillaro

[57] ABSTRACT

A process for making a deep diode atomic battery embodies thermal gradient zone melting techniques for fabricating the structure thereof. Thermal gradient zone melting may also be employed to provide the battery with a radioactive source for energizing the battery.

38 Claims, 12 Drawing Figures

PROCESS FOR MAKING A DEEP DIODE ATOMIC BATTERY

BACKGROUND OF THE INVENTION

1. Field of the Invention

This invention relates to methods for fabricating deep diode, or semiconductor, atomic batteries.

2. Description of the Prior Art

Batteries were the first source of harnassed electric energy used by man and are still one of the most practiced sources of portable electric energy. Most batteries operate on the general principle of converting chemical energy directly into electric energy. As a result of this dependence on chemical reactors, the performance of most batteries can be affected adversely by temperature and pressure changes. In addition, the shelf life of such chemical batteries is relatively limited. Moreover, as a result of the build-up of chemical reaction products from the chemical reactions being utilized to produce electric current, the internal resistance of a chemical battery increases with use so that an increasing share of the electrical energy is dissipated as wasted energy in the battery itself rather than as useful energy in an external load. Another limitation of chemical batteries is the storage capacity of such batteries in terms of available electric energy per unit volume or per unit weight of a battery. For example, electric-powered vehicles have been generally impractical because of this factor. Many chemical batteries must be discarded after use. Those that can be recharged require inconveniently long charging times and can only be subjected to a limited number of charging and discharging cycles. Chemical batteries can be irreparably damaged by accidental short circuiting resulting from failures in the load circuit or structural failures in the battery itself from vibrations or severe accelerational forces.

In the 1950's, a beta-ray radiosotropic battery was developed which was superior in a number of characteristics to the conventional chemical battery. Beta rays consist of a stream of high energy electrons. A beta-ray radio isotope battery can be constructed by using an emitter anode coated with a radio isotope that emits beta-rays (electrons) to a collector cathode that collects the electrons emitted from the radioactive anode. The emitter anode becomes positively charged as beta-rays (electrons with negative charges) leave it and the collector cathode becomes negatively charged as it absorbs these high energy electrons. Because the beta-rays have considerable energy and thus are able to overcome moderate electric field forces, such cells are capable of producing a high voltage if enough time elapses for charges to build up. With a large capacitor in parallel with the beta-ray radioisotope battery, enough charge can be accumulated to give output currents of 40 amps at zero voltage and lower currents at maximum voltages of 6,000 volts after two months.

Other means of transforming the energy emitted in radioactive decay into electrical energy have been developed in recent years. Flourescence/Photoelectric batteries achieve an indirect nuclear to electrical energy conversion by using radiation to excite fluorescent material and using the generated light to operate a photoelectric cell. The overall efficiency of this battery is very low because it utilizes two low efficiency processes.

Thermoelectric type batteries use the heat output from a highly radioactive source and the thermoelectric effect to generate electricity. These cells are generally designed to use radioactive sources of thousands of curies. Because of the low penetration ability of alpha particles, alpha particle emitters are used in these cells so that low radioactivity levels outside of the cell are obtainable without excess shielding.

Gas ionization batteries have also been developed using particles emitted from a radioactive source to generate numerous ion pairs in the gas, the "electrolyte" of the battery. The anode and the cathode are metals that have a large contact potential difference between them so that an electric field exists between the anode and thode. This field separates the positive and negative ions and causes them to drift to opposite electrodes where they are discharged and cause a current in the external circuit of the battery. The output of this type of cell gives about one-half volt and several microamps.

Thermionic batteries have been constructed using the heat output from a radioactive source to liberate electrons from an anode with a low work function and to collect these same thermal electrons on a cold cathode. Efficiencies of up to 15 percent are possible with this type of battery.

P-N junction barriers have been made by irradiating a P-N junction with Beta particles. The electron-hole pairs formed by the absorption of the high energy beta particles are separated by the built in field of the P-N junction and thereby produce a current. Relatively high efficiencies are possible because each high energy beta particle produces many electron-hole pairs.

Finally, Compton scattering batteries have been made which employ gamma rays from a gamma emitter. In this battery the anode and the cathode are separated by an insulating material. Gamma rays emitted from a radioactive source separated from the anode knock electrons out of the insulator material with a preferential forward direction onto the anode where they are collected. The efficiency of this battery is very low.

An object of this invention is to provide a new and improved method for fabricating a deep diode atomic battery which overcomes the deficiencies of the prior art.

An object of this invention is to provide a new and improved method for fabricating a deep diode atomic battery embodying thermal gradient zone melting to fabricate the structure of the battery.

Another object of this invention is to provide a new and improved method for providing an integral source of energy for powering a deep diode atomic battery.

Other objects of this invention will, in part, be obvious and will, in part, appear hereinafter.

Brief Summary of the Invention

In accordance with the teachings of this invention, there is provided a new and improved method for fabricating a deep diode atomic battery. The method includes selecting a body of single crystal semiconductor material so that the body has a first type conductivity, a selected resistivity, and at least one major surface having a preferred planar crystal structure orientation. The planar orientation is one selected from the group consisting of 111, 100 and 110. The vertical axis of the body is substantially aligned with a first axis of the crystal structure. The major surface is etched selectively to form at least one array of depressions in the surface. A metal is preferably vapor deposited into the etched depressions. The metal includes at least one element suitable for causing the material of the body to have a selected type conductivity and a selected level of resistivity.

The body and the metal are heated to an elevated temperature to form a melt of metal-rich material in each of the depressions. A thermal gradient is established within the body and the melt is migrated through the body. The result is that the body is divided into a plurality of first and second regions of opposite type conductivity. The first regions are of the same type conductivity as the body. The second regions are recrystallized material of the body having solid solubility of the vapor deposited metal therein. The metal is substantially uniformly distributed through the second region. The level of concentration of the metal throughout the second region is dependent upon the temperature at which the metal was migrated through the body. A P-N junction is formed by the abutting surfaces of each mutually adjacent first and second regions of opposite type conductivity.

Suitable means are provided within the body for disposing a radioactive source of energy therein in a predetermined relationship with the plurality of first and second regions of opposite type conductivity. Electrical connecting means are provided to enable like regions of conductivity to be connected together in a preselected electrical circuit arrangement.

The battery may be fabricated as part of an integral circuit or it may be manufactured as a discrete device. The radioactive source may be buried within the body as a mass, distributed throughout a selected region by a thermal gradient zone melting technique or physically placed separately within a cavity formed in the body.

Suitable materials for comprising the body are silicon, germanium, silicon carbide and gallium arsenide. The radioactive source is one selected from the group consisting of a gamma emitter, a beta emitter and an x-ray emitter. The material of the second regions is recrystallized semiconductor material of the body and of the first regions and contains a substantially uniform level of an dopant impurity material throughout each second region and is sufficient to impart the second and opposite type conductivity thereto. P-N junctions are formed by the contiguous surfaces of pairs of regions of opposite type conductivity. Electrical contacts are affixed to the respective regions of first type conductivity and to the region of second type conductivity which become the anode and cathode of the battery.

The semiconductor atomic battery is energized by inserting a radioactive gamma or x-ray source into the central cavity in the semiconductor body. The dimensions of the semiconductor body are large enough so that a large proportion of the gamma or x-rays emitted from the central cavity in the semiconductor body are absorbed by the semiconductor body thereby enabling the battery to have a high efficiency and a low level radioactivity level at its external major surfaces. The dimensions and geometry of the regions of first type conductivity and regions of second type conductivity are chosen so that the distance from any point in the regions of first or second type conductivities to the nearest P-N junction formed by the contiguous surfaces of these regions is less than the minority carrier diffusion length in these regions. The radioactive source has a high specific activity and the energy level of the gamma or x-rays is selected to be less than the energy necessary to cause displacement of atoms in the semiconductor material of which the battery is comprised to avoid radiation damage to the semiconductor body.

The semiconductor atomic battery operates by the conversion of the gamma or x-rays emitted from the sources in the semiconductor body into electron-hole pairs on absorption by the surrounding semiconductor body. Because all points in the semiconductor body are within a minority carrier diffusion distance of a P-N junction, the majority of electron-hole pairs are separated by the built-in field of the P-N junction before they recombine. The separated electron-hole pairs forward bias the P-N junction and thus deliver power to an electrical load connected to the battery. Each absorbed gamma ray produces a plurality of electron-hole pairs to boost the current of the battery.

Description of the Invention

Figure 1:
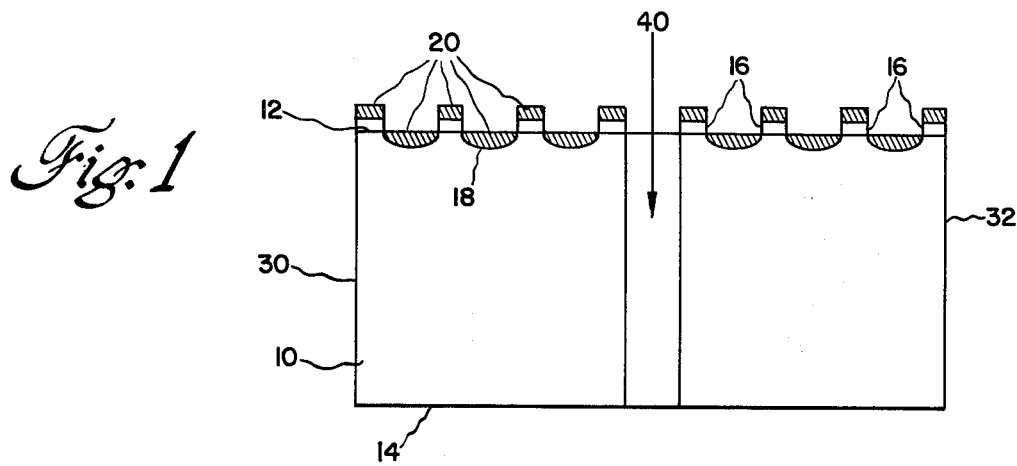
FIG. 1 is a side elevation view, in cross-section, of a semiconductor body being processed in accordance with the teachings of this invention.

With reference to FIG. 1, there is shown a body 10 of semiconductor material having a selected resistivity and a first type conductivity. The body 10 has opposed major top and bottom surfaces 12 and 14, respectively, and opposed major side surfaces 30 and 32. The semiconductor material comprising body 10 may be silicon, germanium, silicon carbide, gallium arsenide, a semiconductor compound of a Group II element and a Group VI element and a semi-conductor compound of a Group III element and a Group V element. In order to describe the invention more fully, we will refer to the semiconductor material as being silicon.

A central cavity 40 is first made in the semi-conductor body 10 by grinding, ultrasonic drilling or sandblast drilling. The cavity 40 is preferably located midway between side surface 30 and 32 and extends between, and is perpendicular to, the opposed major surfaces 12 and 14. Alternatively, cavity 40 may terminate midway between the opposed major surfaces 12 and 14. The body 10 is mechanically polished, chemically etched to remove any damaged surfaces, rinsed in deionized water and dried in air. A preferential acid resistant mask 16 is disposed on surface 12 of the body 10. Preferably, the mask 16 is of silicon oxide which is either thermally grown or vapor deposited on the surface 12 by any of the methods well known to those skilled in the art. Employing well known photolithographic techniques, a photoresist such, as for example Kodak Metal Etch Resist, a disposed on surface of the silicon oxide layer 16. The resist is dried by baking at a temperature of about 80° C. A suitable mask of an array of spaced lines or dots of a predetermined dimension and spaced a predetermined distance apart is disposed on the layer of photoresist and exposed to ultraviolet light. After exposure the layer of photoresist is washed in xylene to open windows in the mask where the lines or dots are desired so as to be able to selectively etch the silicon oxide layer 16 exposed in the windows.

The separation distances between the dots on lines of the array are equal to or less than the minority carrier diffusion length within the semiconductor material of body 10. The thickness of the lines of the array or the width of the dots of the array are all equal to or less than the minority carrier diffusion length in the recrystallized semiconductor material of the body 10.

Selective etching of the layer 16 of silicon oxide is accomplished with a buffered hydrofluoric acid solution ($NH_4$ — HF). The etching is continued until a second set of windows corresponding to the windows of the photoresist mask are opened in layer 16 of the silicon oxide to expose selective portions of the surface 12 of the body 10 of silicon. The processed body 10 is rinsed in deionized water and dried. The remainder of the photoresist mask is removed by immersion in concentrated sulphuric acid at 180° C or immersion in a mixture of 1 part by volume hydrogen peroxide and 1 part by volume concentrated sulphuric acid.

Selective etching of the exposed surface area of body 10 is accomplished with a mixed acid solution. The mixed acid solution is 10 parts by volume nitric acid, 70%, 4 parts by volume acetic acid, 100% and 1 part by volume hydrofluoric acid, 48%. At a temperature of from 20° C to 30° C, the mixed solution selectively etches the silicon of body 10 at a rate of approximately 5 microns per minute. A depression 18 is etched in the surface 12 of the body 10 beneath each window of the oxide layer 16. The selective etching is continued until the depth of the depression 18 is approximately equal to the width of the windows in the silicon oxide layer 16. However, it has been discovered that the depression 18 should not be greater than approximately 100 microns in depth because of undercutting of the silicon oxide layer 16 will occur. Undercutting of the layer 16 of the silicon oxide has a detrimental effect on the surface penetration ability of the metal to be placed in the depressions 18 by vapor deposition. Etching for approximately 5 microns at a temperature of 25° C will result in a depression of from 25 to 30 microns. The etched body 10 is rinsed in distilled water and blown dry. Preferably, a gas such for example, as freon, argon and the like is suitable for drying the processed body 10.

The processed body 10 is disposed in a metal evaporation chamber. A metal layer 20 is deposited on the remaining portions of the layer 16 of silicon oxide and on the exposed silicon in the depressions 18. The metal of the layer 20 comprises a material, either substantially pure in itself or suitably doped by one or more materials to impart a second and opposite type conductivity to the material of body 10 through which it migrates. The thickness of layer 20 is approximately equal to the depth of the depression 18. Therefore, if the depression 18 to 20 microns deep, the layer 20 is approximately 20 microns in thickness. A suitable material for the metal layer 20 is aluminum to obtain P-type regions in N-type silicon semiconductor material. Prior to migrating the metal in depressions 18 through the body of silicon 10, the excess metal layer 20 is removed from the silicon oxide layer 16 by such suitable means as grinding away the excess metal with a 600 grit carbide paper.

It has been discovered that the vapor deposition of the layer 20 of aluminum metal should be performed at a pressure of approximately $1 \times 10^{-5}$ torr but not greater than $5 \times 10^{-5}$ torr. When the pressure is greater than $5 \times 10^{-5}$ torr, we have found that in the case of aluminum metal vapor deposited in depressions 18, the aluminum does not penetrate into the silicon and migrate through the body 10. It is believed that the layer of aluminum is saturated with oxygen and prevents reduction by the aluminum metal of the very thin silicon oxide layer between the deposited aluminum and the silicon, that was formed in the air shortly after etching the troughs 18. Thus, the initial melt of aluminum and silicon required for migration is not obtained because of the inability of the aluminum layer to wet and alloy with the underlaying silicon. In a similar manner, the aluminum deposited by sputtering is not as desirable as sputtered aluminum appears to be saturated with oxygen from the sputtering process, thereby preventing the reduction of any intervening silicon oxide. The preferred methods of depositing aluminum on the silicon body 10 are by the electron beam method and the like wherein little, if any, oxygen can be trapped in the aluminum.

The processed body 10 is placed in a thermalmigration apparatus, not shown, and the metal-rich liquid bodies in the depressions 18 are migrated through body 10 by thermal gradient zone melting process. A thermal gradient of approximately 50° C/cm between the bottom surface 14 which is the hot face and the surface 12, which is the cold face, has been discovered to be appropriate at an apparatus operating temperature of from 800° to 1,400° C. The process is practiced for a sufficient length of time to migrate all the metal-rich liquid bodies through the body 10. For example, for aluminum-rich liquid bodies of 20 microns thickness, a thermal gradient of 50° C/cm, and a 1200° C mean temperature of body 10, a furnace time of less than 12 hours is required to migrate the metal-rich liquid bodies through a silicon body 10 of one centimeter thickness.

The temperature gradient zone melting process and apparatus is not a part of this invention. For a more thorough understanding of the temperature gradient zone melting process employed in this invention and for a more thorough description of the apparatus employed for this process, one is directed to our copending applications entitled Method of Making Deep Diodes, Ser. No. 411,150, now U.S. Pat. No. 3,901,736; Deep Diode Device Production and Method, Ser. No. 411,021, now abandoned in favor of Ser. No. 552,154; Deep Diode Devices and Method and Apparatus, Ser. No. 411,001; High Velocity Thermomigration Method of Making Deep Diodes, Ser. No. 411,015; now U.S. Pat. No. 3,898,106; Deep Diode Device Having Dislocation-Free P-N Junctions and Method, Ser. No. 411,009 now U.S. Pat. No. 3,902,925; and The Stabilized Droplet Method of Making Deep Diodes Having Uniform Electrical Properties, Ser. No. 411,008 now U.S. Pat. No. 3,899,361.

It has been discovered that when the substrate or body 12 is silicon, germanium, silicon carbide, gallium arsenide semiconductor material and the like, the migrating metal droplet has a preferred shape which also gives rise to the regions being formed to have the same shape as the migrating droplet. In a crystal axis direction of $<111>$ of thermal migration, the droplet migrates as a triangular platelet laying in a 111 plane. The platelet is bounded on its edges by 112 planes. A droplet larger than 0.10 centimeter on an edge is unstable and breaks up into several droplets during migration. A droplet smaller than 0.0175 centimeter does not migrate into the substrate 212 because of a surface barrier problem.

The ratio of the droplet migration rate over the imposed thermal gradient is a function of the temperature at which migration of the droplet is practiced. At high temperatures, of the order of from 1,000° C to 1,400° C, the droplet migration velocity increases rapidly with increasing temperature. A velocity of 10 centimeters per day or $1.2 \times 10^{-4}$ centimeter per second is obtainable for aluminum droplets in silicon.

The droplets migration rate is also affected by the droplet volume. In an aluminum-silicon system, the droplet migration rate decreases by a factor of two when the droplet volume is decreased by a factor of 200.

A droplet migrates in the $<100>$ crystal axis direction as a pyramid bounded by four forward 111 planes and a rear 100 plane. Careful control of the thermal gradient and migration rate is a necessity. Otherwise, a twisted region may result. It appears that there is a non-uniform dissolution of the four forward 111 facets in that they do not always dissolve at a uniform rate. Non-uniform dissolution of the four forward 111 facets may cause the regular pyramidal shape of the droplet to become distorted into a trapezoidal shape.

For a more thorough understanding of the temperature gradient zone melting process and the apparatus employed for process, one is directed to our aformentioned copending patent applications. Copending applications "Isolation Junctions With Semiconductor Devices," Ser. No. 411,012, now abandoned in favor of Ser. No. 556,726 and "Thermomigration of Metal-Rich Liquid Wires Through Semiconductor Materials", Ser. No. 411,018, now U.S. Pat. No. 3,899,362, described the isolation grid and its process.

The migration of metal wires is preferably practiced in accordance with the planar orientations, thermomigration directions, stable wire directions and stable wire sizes of the following Table.

| Wafer Plane | Migration Direction | Stable Wire Directions | Stable Wire Sizes |
|---|---|---|---|
| (100) | $<100>$ | $<011>$* | < 100 microns |
|  |  | $<0\bar{1}1>$* | < 100 microns |
| (110) | $<110>$ | $<1\bar{1}0>$* | < 150 microns |
| (111) | $<111>$ | a) $<01\bar{1}>$ |  |
|  |  | $<\bar{1}0\bar{1}>$ | < 500 microns |
|  |  | $<1\bar{1}0>$ |  |
|  |  | b) $<11\bar{2}>$* |  |
|  |  | $<\bar{2}11>$* | < 500 microns |
|  |  | $<1\bar{2}1>$* |  |
|  |  | c) Any other* direction in (111) plane | < 500 microns |

*The stability of the migrating wire is sensitive to the alignment of the thermal gradient with the $<100>$, $<110>$ and $<111>$ axis, respectively.
†Group a is more stable than group b which is more stable than group c.

The invention has been described relative to practicing thermal gradient zone melting in a negative atmosphere. However, it has been discovered that when the body of semiconductor material is a thin wafer of the order of 10 mils thickness, the thermal gradient zone melting process may be practiced in an inert gaseous atmosphere of hydrogen, helium, argon and the like in a furnace having a positive atmosphere.

Figure 2:
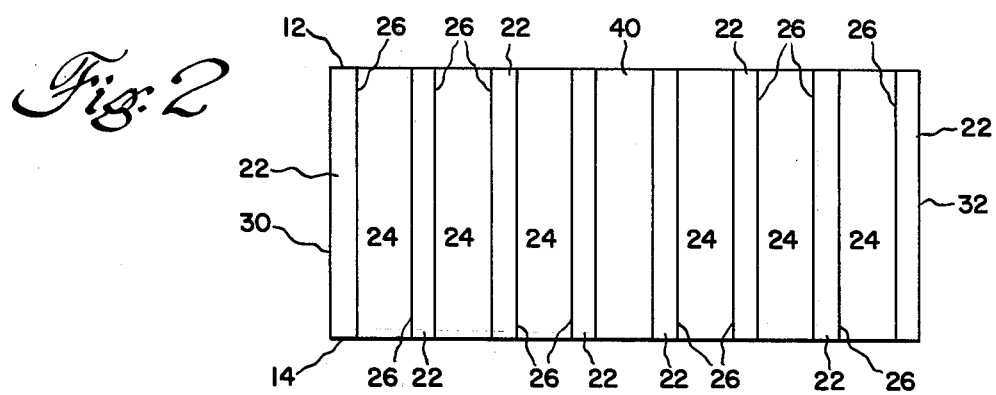
FIG. 2 is a side elevation view, in cross-section, of the same semiconductor body after temperature gradient zone melting processing in accordance with the teachings of this invention.

Upon completion of the temperature gradient zone melting process, the resulting processed body 10 is as shown in FIG. 2. The migration of the metal-rich liquid bodies in the depressions 18 through the body 10 produces the body 10 having a plurality of first spaced regions 24 of a second and opposite type conductivity than the material of the body 10. Each region is recrystallized material of the body 10 suitably doped with a material comprising the metal layer 20 and having an impurity concentration sufficient to obtain the desired conductivity. The metal retained in the recrystallized region is substantially the maximum allowed by the solid solubility of the metal at the migration temperature practiced in the semiconductor material through which it has been migrated. It is recrystallized material having solid solubility of the metal therein. The region 24 has a substantially constant uniform level of impurity concentration throughout the entire planar region. The region 24 has less crystal imperfections and extraneous impurities than the original material of the body. The thickness of the region 24 is substantially constant for the entire region. Depending upon the geometry of the original deposited array of metalrich liquid bodies, the crystallographic plane of deposition and the crystallographic direction of migrations, regions 24 can be a lamellar array of planar zones, an array of square columnar zones, an array of triangular columnar zones, an array of diamond-shaped columnar zones, a regular array of hexagonal columnar zones, a square array of planar zones, a triangular array of planar zones, a diamond array of planar zones or a hexagonal array of planar zones. The peripheral surface of each planar or columnar region 24 comprises in part the top surface 12 and the bottom surface 14 of the body 10. In addition, the peripheral surface of each planar zone comprises in part the peripheral side surfaces of the body 10.

The body 10 is also divided into a plurality of spaced regions 22 having the same, or first, type conductivity as the body 10. A P-N junction 26 is formed by the contiguous surfaces of each pair of mutually adjacent regions 22 and 24 of opposite type conductivity. The P-N junction 26, as formed, is very abrupt and distinct, resulting in a step junction.

When regions 24 are planar regions, the regions are made so that the planar thickness does not exceed twice the minority carrier diffusion distance in the recrystallized material containing the dopant impurity that imparts the second and opposite type conductivity to regions 24. When regions 24 are columnar regions, the regions have a maximum cross-sectional dimension that does not exceed twice the minority carrier diffusion distance in the recrystallized material containing the dopant impurity that imparts the second and opposite type conductivity to regions 24. When regions 24 are recrystallized silicon containing the solid solubility limit of aluminum of $2 \times 10^{19}$ atoms/cm$^3$ and the lifetime of this recrystallized material is 1 micro second, then the critical cross-sectional dimension of regions 24 must not exceed 70 microns or twice the minority carrier diffusion length in the recrystallized P-type silicon.

In a similar fashion, the maximum cross-sectional width of regions 22 must not exceed twice the minority carrier diffusion length in the semiconductor material comprising regions 22. For N-type silicon of $5 \times 10^{14}$ carriers/cm$^3$ and a minority carrier lifetime of $20 \times 10^{-6}$ microseconds, this critical cross-sectional width for regions 22 must not exceed 150 microns or twice the minority carrier diffusion length in the N-type silicon. With all points in the semiconductor body 10 within a minority carrier diffusion length of a P-N junction 26, most of the electron-hole pairs created by the absorption of a gamma ray or x-ray form a source in the central cavity 40 will be collected and separated by the P-N junctions 26 before recombination. Efficient collection of the generated electron-hole pairs by P-N junctions 26 will lead to an efficient battery. The resulting structure of body 10 after thermal gradient processing is shown in FIG. 2 wherein the body 10 has a central cavity 40 to contain a gamma emitter or an x-ray emitter and regions 22 and 24 of opposite type conductivity forming P-N junctions 26 at interfaces between regions 22 and 24.

Figure 3:
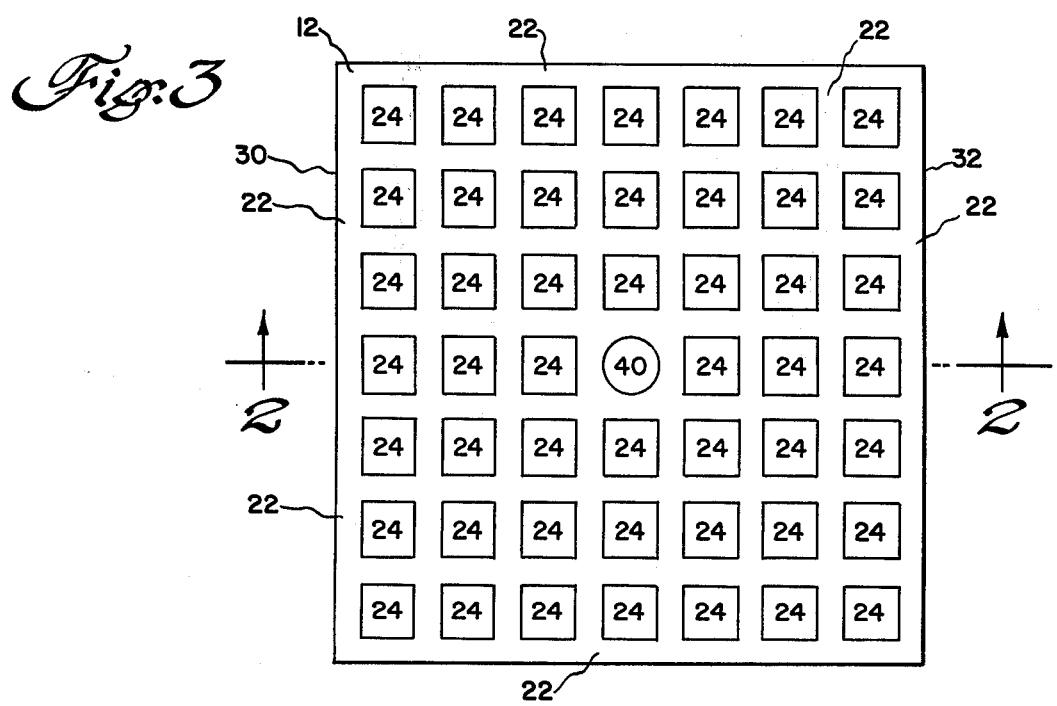
FIG. 3 is a top planar view of the semiconductor body of FIG. 2 incorporating an array of square columnar P-N junctions.

Referring now to FIG. 3, a square columnar array of regions 24 is shown embedded in region 22. This structure is obtainable by depositing an aluminum layer 20 in a square array of square depressions 18 on a 100 crystallographic plane of silicon and migrating the resulting aluminum-rich liquid droplets in a <100> crystallographic direction. The square array and the square depressions are aligned so that their sides are parallel to the < 011> and < 0$\bar{1}$1 > directions.

Figure 4:
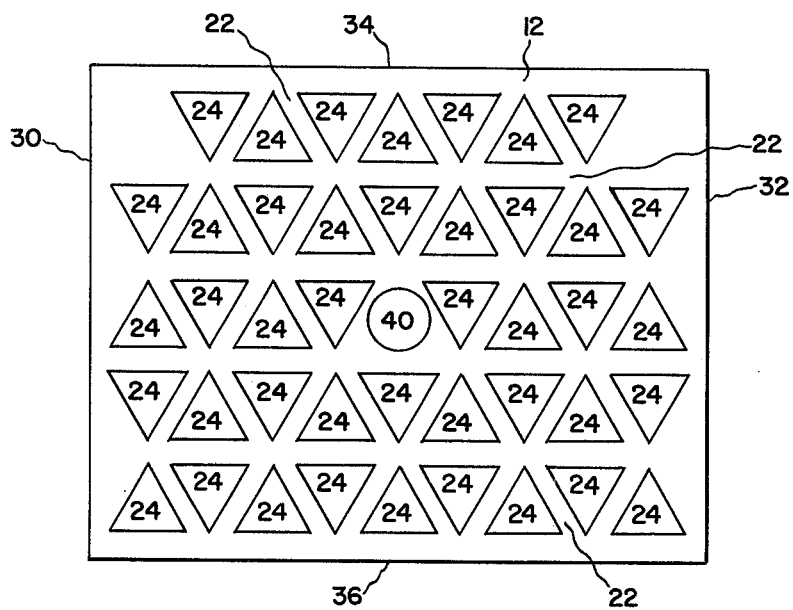
FIG. 4 is a top planar view of the semiconductor body of FIG. 2 with a close packed array of triangular columnar P-N junctions.

Referring now to FIG. 4, a triangular columnar array is obtainable by depositing an aluminum layer 20 in a triangular array of triangular depressions 18 on a 111 crystallographic plane of silicon and migrating the resulting aluminum-rich liquid droplets in a <111> crystallographic direction. The triangular shaped regions of the array are aligned so that their three sides are parallel to the < 0$\bar{1}$1 >, the < $\bar{1}$01 > and the < $\bar{1}$10 > directions, respectively.

Figure 5:
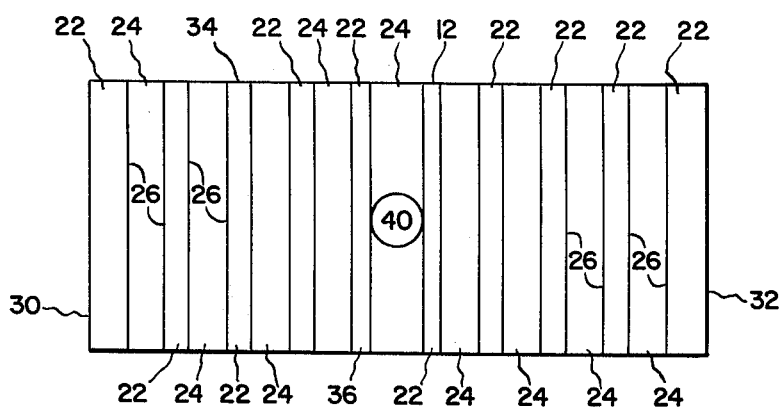
FIG. 5 is a top planar view of the semiconductor body of FIG. 2 incorporating a lamellar array of planar P-N junctions.

Referring now to FIG. 5, a lamellar array of planar zones is made by depositing an aluminum layer 20 in a parallel linear wire-like array of the depressions or troughs 18 on a 111 crystallographic plane of silicon and migrating these wire-like zones in a < 111 > direction. On a 111 silicon wafer, the preferred line direction of the wire-like liquid zones is a < 01$\bar{1}$ >, a < $\bar{1}$0$\bar{1}$ > or a < $\bar{1}$10 > direction. However, other line directions, other crystallographic planes and other migration directions are also capable of producing planar lamellar arrays.

Figure 6:
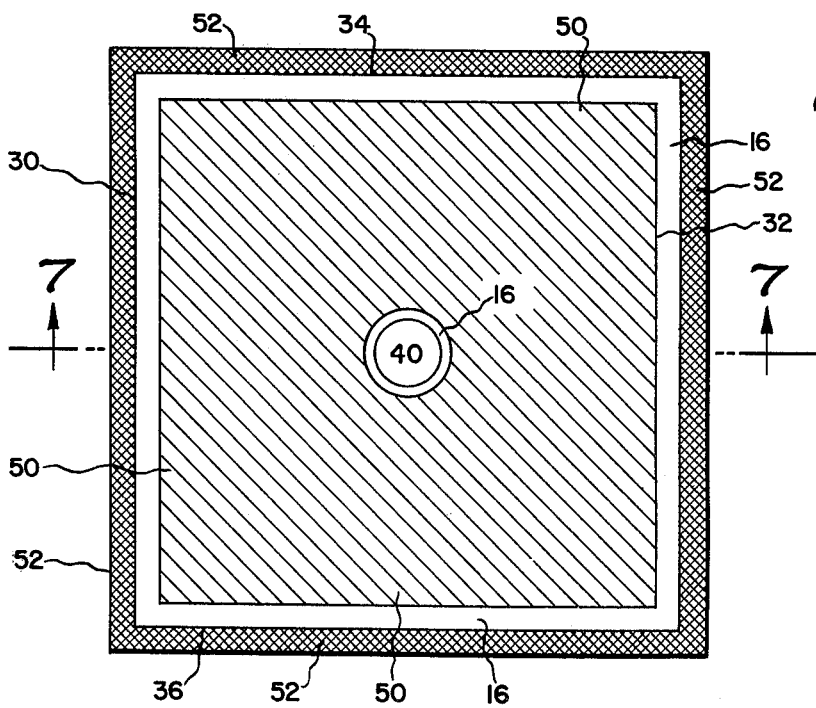
FIG. 6 is a top planar view of the metallized anode and cathode of a deep diode atomic battery with all individual cells connected in parallel.

With reference to FIG. 6, electrical contacts for collecting the carriers which are collected by the P-N junctions 26 are disposed on the top surface 12 and bottom surface 14 and the side surfaces 30, 32, 34 and 36. Ohmic electrical contacts 50 and 52 that electrically connect the deep diode atomic battery to electrical circuits external to the battery are shown disposed on and in an electrical conductive relationship with the respective regions 24 and 22 of opposite type conductivity. A layer 16 of electrical insulating material such, for example, as silicon oxide, silicon nitride and the like permits bridging by contact 50 and 52 of regions or opposite type conductivity and P-N junctions 26 associated therewith. Electrical leads 56 and 58 are affixed to respective contacts 50 and 52 for electrically connecting the deep diode atomic battery to the electrical circuitry external to the battery.

Figure 7:
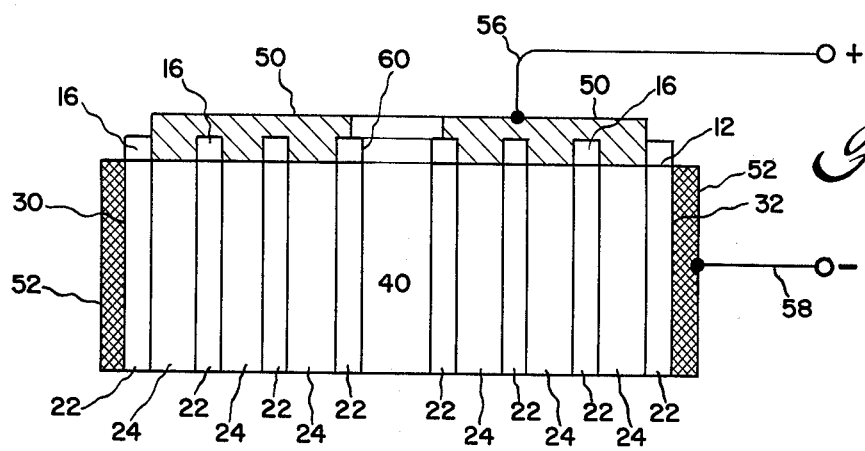
FIG. 7 is a side elevation view, in cross-section, of the metallized anode and cathode of a deep diode atomic battery, wherein all of its individual cells are connected in parallel.

With reference to FIGS. 6 and 7, a deep diode atomic battery with all collecting P-N junctions connected electrically in parallel is shown. These P-N junctions are of a columnar type as those shown in FIGS. 3 and 4. An ohmic electrical contact 50 is affixed to and connects all regions 24 in parallel. A layer of electrical insulating material 16 such, for example, as silicon oxide, silicon nitride and the like, is disposed over regions 22 on top surface 12 to insulate regions 22 from contact 50. A central aperature 60 in the ohmic contact 50 and insulating layer 16 is provided to allow access to the central cavity 40 containing the x-ray or gamma emitter. With the columnar geometry for regions 24 shown in FIGS. 3 and 4, regions 22 are interconnected and continuous so that an ohmic electrical contact on the side peripheral surfaces 30, 32, 34 and 36 can collect carriers separated by the field of the junction 26 and injected into region 22. A deep diode atomic battery with ohmic electrical contacts connecting all regions 24 in parallel will develop a minimum voltage for the cell. This cell voltage is determined by the highest forward bias voltage that can be sustained by the P-N junction 26 before the forward current of the P-N junction becomes larger than the current generated by the junction field separation of electronhole pairs produced by absorbed gamma rays since the gamma-ray-generated current is in a direction opposite to the forward current of the P-N junction. This voltage is about 0.5 volts for silicon, 0.1 volts for germanium and 1.0 volts for GaAs.

Figure 8:
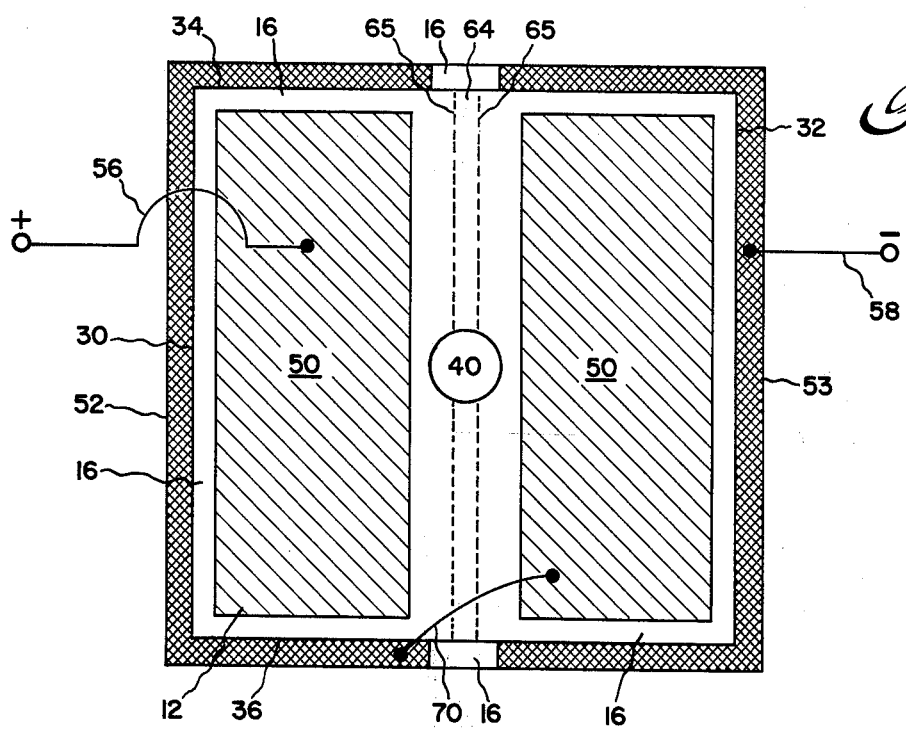
FIG. 8 is a top planar view of the metallized anodes and cathodes of a deep diode atomic battery wherein a group of one half of its individual cells connected in series with a group of the other one half of its individual cells to boost the voltage from the battery.

To increase the voltage of the deep diode atomic battery, a number of the regions 24 can be connected in series as shown in FIG. 8. In this particular design of the deep diode atomic battery, an ohmic electrical contact 50 connects regions 24 to the left of the central cavity 40 in parallel while ohmic electrical contact 51 connects regions 24 to the right of central cavity 40 in parallel. Ohmic contact 52 is affixed to the interconnected region 22 on the left-hand side of the cell on surface 30 and partly on surfaces 34 and 36 while ohmic contact 53 is affixed to interconnected regions 22 on the right hand side of the cell on surface 32 and partly on surfaces 34 and 36. A layer 16 of insulating material such, for example, as silicon oxide, silicon nitride and the like, is disposed on surface 12, 30 and 32, 34 and 36 to insulate the regions of opposite conductivity from their respective ohmic electrical contacts in a manner similar to that shown for the simple deep diode atomic battery in FIG. 7. A planar region 64 of a conductivity type the same as region 24 is produced through the midsection of the battery by migrating a wire-like liquid zone through the midsection of the semiconductor body 10 while the regions 24 are being produced by a similar liquid zone migration process. This planar region 64 electrically isolates the region 22 on the left hand side of the battery of FIG. 8 because of the two back-to-back P-N junctions 65 associated with the region 64 of opposite conductivity type as that of region 22. The two isolated cells of the deep diode atomic battery of FIG. 8 on the left-hand and right-hand side of the isolation zone 64 are connected in series by electrical lead 70 affixed to and bridging between regions 52 and 51. Electrical leads 56 and 58 are affixed to regions 50 and 53 to provide for electrically connecting the deep diode atomic battery to electrical circuitry external to the cell. The maximum voltage of the battery of FIG. 8 would be twice the maximum voltage generated by the battery of FIG. 7, namely 1.0 volts for silicon, 0.1 volts for germanium and 1.0 volts for GaAs.

Additional planar radial isolation zones 64 that pass through the central cavity can be symmetrically formed in the deep diode atomic battery to divide the battery into additional separate cells. Each symmetric radial cell section should enclose equal volumes of semiconductor material and should contain equal areas of P-N junctions 26 to insure that the current produced by all of the cells are approximately equal. The radial cell sections are then connected in series in a manner similar to that shown for the two cell battery of FIG. 8 to provide a multiple-cell series-connected battery with maximum voltage onput equal to the number of cells times the maximum voltage per cell which is 0.5 volt for silicon, 0.1 volt for germanium and 1.0 volt for GaAs.

Figure 9:
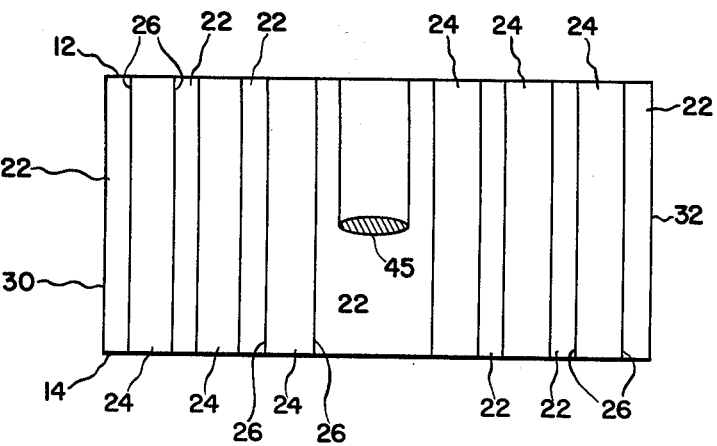
FIG. 9 is an elevation view, in cross-section, of a semiconductor body embodying a buried layer of a radioactive isotope.

Referring now to FIG. 9, there is shown an alternate embodiment of a deep diode atomic battery where the central cavity 40 containing a gamma emitter is replaced by a deep buried layer 45 of gamma emitter material. All items denoted by the same reference numerals as those used in conjunction with FIG. 2 are the same and function in the same manner as described heretofore. This deep buried layer of gamma emitter is formed by depositing a layer of gamma emitter 20 in a central depression 18 on surface 12 either by itself or in a carrier metal, alloying with the semiconductor material of body 10 to form a liquid droplet at high temperatures and migrating the liquid droplet by a thermal gradient zone melting process into the center of the semiconductor body as shown in FIG. 9. Some radioactive material will be left as a dissolved impurity in region 42 but the overwhelming amount of radioactive material will be in the deep buried layer 45. The advantages of this type of atomic battery is that the radioactive material is perfectly sealed in the semiconductor material and no failure in joints, glue, sealant and the like can allow radioactive material to escape to the external environment. Gamma ray emitters that can be used in deep buried layers include Barium 133, Cadmium 109, Calcium 45, Cerium 139, Chromium 51, Cobalt 57, Dysprosium 159, Gold 195, Iodine 125, Iodine 129, Iron 55, Mercury 197, Mercury 203, Nickel 59, Promethium 147, Selenium 75, Thulium 171, Tin 119, Tungsten 181 and Ytterbium 169. These isotopes have been selected because they are available commercially in high specific activities and because the gamma ray energies of these isotopes are below the radiation damage threshold energies of 0.3 Mev for silicon, 0.6 Mev for germanium and 0.6 Mev for GaAs. Above these threshold energies, high speed electrons created by the absorption of a gamma ray can introduce vacancy-interstial pairs in a lattice which act as recombination centers. These radiation-induced recombination centers reduce the lifetime of the semiconductor material and the efficiency of the deep diode atomic battery by causing recombination of generated electron-hole pairs before they can diffuse to and be collected by P-N junctions 26. Because radiation damage is gradually introduced into the crystal structure of the semiconductor body 10 by isotopes with gamma ray energies higher than the radiation damage threshold energy, some isotopes with energies greater than the damage threshold energy can be used in the battery if the rate of introduction of radiation damage is less than the decay rate (inversely proportional to the isotope half-life) of the isotope. In other words, the radiation damage induced in the deep diode atomic battery will not seriously degrade the efficiency of the battery during the useful power-generating lifetime of its gamma emitter source.

Although it is desirable to use gamma emitters with gamma ray energies less than the radiation damaged threshold, there is a great incentive to use the highest energy gamma emitters possible. This great incentive is the power rating of the deep diode atomic battery. Each gamma ray absorbed in the semiconductor material of the battery produces a plurality of electron-hole pairs. The higher the level of gamma ray energy, the greater the quantity of electron-holes which will be produced. Generally, semiconductors require about 3.5 ev of absorbed energy to produce a single electron-hole pair. Thus, for a 0.3 Mev gamma ray, $10^5$ electron-hole pairs will be produced. The power available from the battery will be proportional to the gamma ray energy, the number of gamma rays emitted per unit time by the gamma emitter (the activity of the emitter) and the maximum forward voltage sustainable by the P-N junction before a significant amount of forward current flows (1 volt for GaAs, 0.5 volts for Si and 0.1 volts for Ge) assuming that all these pairs are collected by the P-N junctions 26. With a gamma ray source of 200 curies activity ($7.4 \times 10^{12}$ gamma rays per second), a gamma ray energy of 0.3 Mev and a semiconductor body 10 of GaAs, the maximum power generated by a deep diode atomic battery is about one tenth of a watt and is sufficient to operate semiconductor devices, integrated circuits, solid state lamps and liquid crystal displays for extended periods of time.

Figure 10:
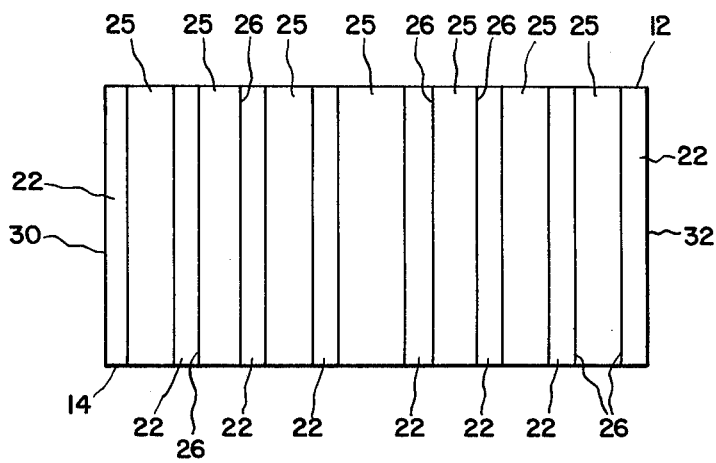
FIG. 10 is an elevation view, in cross-section, of a semiconductor body with a radioactive isotope contained as an impurity at its solid solubility limit in the regions of second type conductivity.

Referring now to FIG. 10, a third means of incorporating the radioactive gamma or x-ray emitter in the deep diode atomic battery is shown wherein the regions 25 of a second and opposite type of conductivity to regions 22 contain a gamma or an x-ray emitter having solid solubility of the radioactive element therein. This radioactive element is dissolved in regions 25 by the process of temperature gradient zone melting as described heretofore with reference to FIGS. 1 and 2. A high specific activity element is deposited as a metal layer 20 itself or in a metal alloy layer 20 in depressions 18 on surface 12 of a semiconductor body 10. The semiconductor body 10 is placed in a migration apparatus where a temperature gradient is applied across the sample perpendicular to major surfaces 12 and 14. The liquid zone formed in depressions 18 when the metal layer 20 alloys with the semiconductor body 10 migrate up the temperature gradient from the relatively cold surface 12 to the relatively hot surface 14 and leave behind in the recrystallized material of the liquid zone trails 25 (FIG. 9) the solid solubility of the constituents of the metal layer 20. Consequently, if the metal layer contains an appropriate doping species and a suitable gamma or x-ray emitter, the recrystallized region 25 will contain substantially the solid solubility limit of the radioactive emitter and solid solubility limit of the dopant species which imparts a second and opposite type conductivity to regions 25 with respect to region 22 of the original semiconductor material of the body 10. Because the radioactive source is distributed uniformly with respect to the P-N junctions 26, all P-N junctions 26 will collect equal amounts of current carriers during operation of the battery. Thus, the restriction of the radial symmetry of multiple cell series connections stipulated with respect to the deep diode atomic battery with a radioactive emitter in the central cavity 40 of FIG. 8 does not hold in this latter case. In addition, β emitters can be substituted for gamma emitters in this case since all P-N junctions 26 will be within a carrier diffusion distance of electron-hole pairs created by low penetrating beta-rays.

Alternative embodiments of the central cavity 40 is an array of cavities distributed uniformly in the semi-conductor body 10 containing gamma emitters. In a similar fashion, an alternative embodiment of the central deep buried layer 45 illustrated in FIG. 9 is an array of deep buried layers distributed uniformly throughout the semiconductor body 10.

Figure 11:
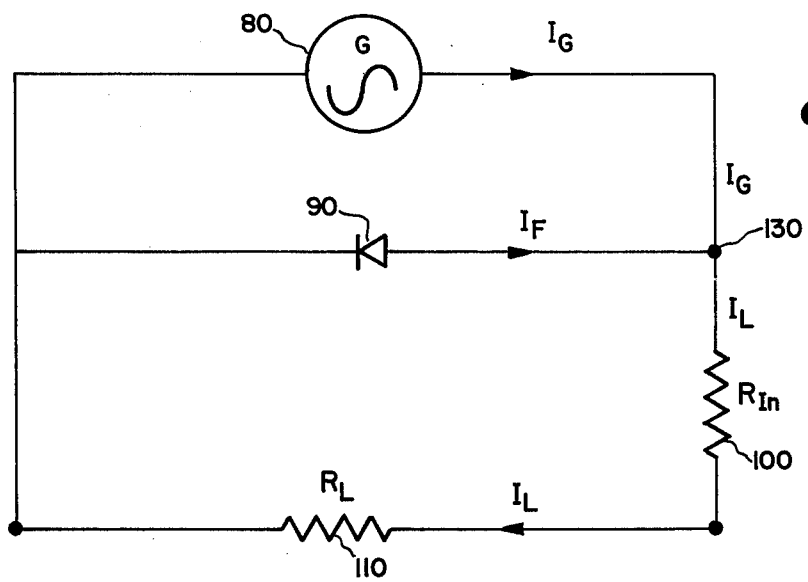
FIG. 11 is a schematic of an electrical circuit of a deep diode atomic battery.

With a single central cavity 40 or a single central deep buried layer 45 in a deep diode battery, some restrictions must be made on the major dimensions of the deep diode atomic battery so that it generates the maximum power available from the radioactive emissions from the central source. Referring now to FIG. 11, the equivalent electrical circuit of a deep diode atomic battery connected to an external load is shown. Generator 80 represents the generation of current by the P-N junction 26 field separation of electron-hole pairs created by the absorption of a gamma ray. This generator produces a current $I_G$ with a direction flow as indicated in FIG. 11. The field separation and injection of electrons into the N side and holes in the P side of the P-N junction forward biases the P-N junction. In response to this forward bias, the P-N junction acts as a forward biased diode 80 which passes a forward current $I_F$ in the direction indicated in FIG. 11. The forward bias voltage is also applied across the internal resistance 100 of the deep diode atomic battery and the external load 110 resulting in a current flow through the external load of $I_L$ in the direction indicated in the figure. The useful power of the battery is the external load resistance $R_L$ times the external load current $I_L$. The restriction on the dimensions of the battery arises from the unequal differential increases of the generated current $I_G$ and the forward current $I_F$ with increasing P-N junction area coming from an increase of dimensions of the semiconductor body 10. If the deep diodes in any radial section are connected in parallel, those closest and those farthest from the gamma emitter in the central cavity will have an equal forward bias and thus equal forward currents. However, because the gamma rays emitted from the central cavity are exponentially absorbed in a radial direction from the central cavity 40, the intensity of gamma ray radiation will be less at the deep diode farthest from the central cavity in comparison to the deep diode adjacent to the central cavity 40. Consequently, the current generated by the gamma rays and collected by a P-N junction 26 falls off exponentially along a radial line away from the central cavity 40 while the forward current remains constant. The radial dimension in the semiconductor body at which the density of current generated by gamma ray absorption and P-N junction field separation falls below the forward current produced by the forward bias of the P-N junction is the maximum dimension that the deep diode atomic battery should have for maximum efficiency. Beyond this dimension, the load current $I_L$ passing through the external load $R_L$ and thus the power rating of the battery begins to decrease because by Kirkoff's Laws $I_L = I_G - I_F$ as is shown in FIG. 11 at point 130 in the equivalent electrical circuit of the battery.

With continuing reference to FIG. 11, it is desirable to reduce the internal resistance 100 of the deep diode atomic battery in order to decrease internal resistance losses in the battery cells and to provide a battery with maximum power. Consequently, the specific resistivity of regions 24 and 22 of FIGS. 2, 3, 4, 5, 7, 9 and regions 25 and 22 of FIG. 10 should be relatively low and the cross-sectional areas of these regions should be as large as possible consistent with the requirement that the maximum cross-sectional width of these regions does not exceed twice the minority carrier diffusion distance. Low internal resistance is easily obtained in the geometric configuration of P-N junctions associated with the deep diode atomic battery. For example, for silicon of a 20 microsecond minority carrier lifetime, the cross-sectional width of the regions of opposite conductivity can be 300 microns. Also, if the metal layer 20 of FIG. 1 is aluminum, the specific resistivity of regions 24 will be a low $8 \times 10^{-3}$ ohm-cm after migration of the aluminum rich liquid zones through the silicon. Thus, the resistivity of an individual columnar region 24 (see FIGS. 3 and 4) of 1 cm in length is about 10 ohms. If a $100 \times 100$ columnar array is connected in parallel, the internal resistance is only $10^{-3}$ ohms. With a 200 Curie source with 0.3 mev gamma rays and a 50% electron-hole collection efficiency, only about $10^{-5}$ watts are dissipated in internal resistance losses of the deep diode atomic battery or less than 0.1 percent of the power of the battery.

Figure 12:
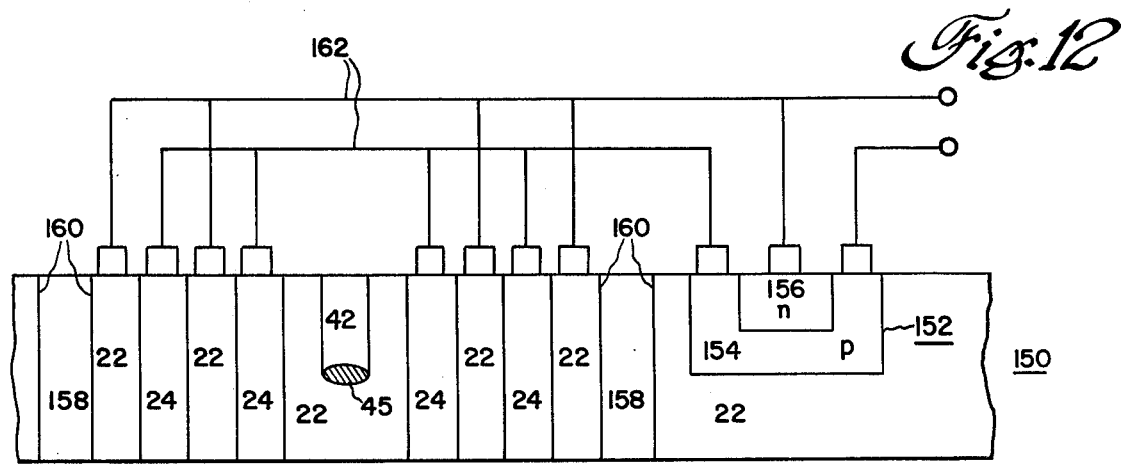
FIG. 12 is a side elevation view, partly in cross-section of a portion of an integrated circuit embodying a deep diode atomic battery.

With reference now to FIG. 12, there is shown a portion of an integrated circuit device 150. A deep diode atomic battery of the configuration of FIG. 9 is shown fabricated in the device 150 as an integral source of electrical energy for operating a device 152. For simplicity only, the device 152 is shown as a diode of P region 154 and N region 156. The diode or device 152 may be made by any suitable means known to those skilled in the art. The device 152 is electrically isolated from the atomic battery by a region 158 and its associated P-N junction 160. The region 158 is fabricated by such suitable means as double diffusion and thermal gradient zone melting. Electrical means 162 are provided to energize the devices 152 by the battery.

Although the device 150 has been shown embodying a buried source 45 of radioactive material, the other battery configurations and radioactive sources described heretofore may also be incorporated in the device 150 to comply with design requirements.

We claim as our invention:

1. A process for making a deep diode atomic battery comprising the steps of:
   a. selecting a body of single crystal semiconductor material so that the body has a first type conductivity, a selected resistivity, and at least one major surface having a preferred planar crystal structure orientation which is one selected from the group consisting of (100), (110) and (111), the vertical axis of the body being substantially aligned with a first axis of the crystal structure;
   b. etching selectively the surface having the preferred planar crystal structure orientation to form at least one array of depressions in the surface;
   c. vapor depositing a layer of a metal in the depressions of the at least one array on the selected surface of the body of semiconductor material;
   d. heating the body and the metal to a temperature sufficient to form a melt of metal-rich material in each of the depressions on the surface of the body;
   e. establishing a temperature gradient along substantially the vertical axis of the body and the first axis of the crystal structure;
   f. migrating the metal-rich melt through the body along the first axis of the crystal structure to divide the body into a plurality of regions of first type conductivity and to form at least one array of regions of recrystallized material of the body having solid solubility of the vapor deposited metal therein, the metal including at least one dopant impurity material therein to impart a second and opposite type conductivity and a selected level of resistivity thereto;
   g. providing a means for disposing a source of radioactive material within the body in a predetermined relationship with the material of the body and the material of regions of the at least one array;
   g. electrically connecting the plurality of first type regions into a first internal electrical circuit arrangement, and
   i. electrically connecting the plurality of second type regions into a second internal electrical circuit arrangement.

2. The method of claim 1 wherein
the semiconductor material of the body is one selected from the group consisting of silicon, silicon carbide, gallium arsenide and germanium.

3. The process of claim 1 wherein the semiconductor material of the body is N-type gallium arsenide, and
the metal is gallium containing zinc.

4. The process of claim 2 wherein
the semiconductor material of the body is N-type gallium arsenide doped with silicon,
the metal is gallium, and including
selecting the migration rate and migration temperature selected so as to provide recrystallized material comprising the second regions which is P-type gallium arsenide.

5. The process of claim 2 wherein
the preferred planar crystal orientation is (100), and the first crystal axis is < 110 >.

6. The process of claim 5 wherein
the semiconductor material is silicon, and the dopant impurity material is aluminum.

7. The process of claim 2 wherein
the preferred planar crystal orientation is (100), and the first crystal axis is < 100 >.

8. The process of claim 7 wherein
the semiconductor material is silicon, and the dopant impurity material is aluminum.

9. The process of claim 1 wherein
the surface which is selectively etched has a preferred planar crystal orientation which is one selected from the group consisting of (111), (100) and (100).

10. The process of claim 9 wherein
the preferred planar crystal orientation is (111), and the first crystal axis < 111 >.

11. The process of claim 10 wherein
the semiconductor material of the body is silicon of N-type conductivity, and
the dopant impurity aluminum.

12. The process of claim 9 wherein
providing a means for disposing a source of radioactive material within each atomic battery includes
providing at least one cavity within a predetermined portion of the first region, the cavity being defined by walls extending into the body a predetermined distance from one of the major opposed surfaces, the walls being substantially perpendicular to that major surface, and
disposing a radioactive source within each cavity, the radioactive source being one selected from the group consisting of a gamma emitter, a beta emitter and an x-ray emitter.

13. The process of claim 12 wherein
each cavity is defined by walls extending between, and terminating in, the two major opposed surfaces.

14. The process of claim 13 wherein
the semiconductor material is silicon of N-type conductivity, and
the dopant impurity material is aluminum.

15. The process of claim 12 wherein
the semiconductor material is silicon of N-type conductivity, and
the dopant impurity material is aluminum.

16. The process of claim 15 wherein
providing a means for disposing a source of radioactive material within each atomic battery includes
providing at least one cavity within a predetermined portion of the first region, the cavity being defined by walls extending into the body a predetermined distance from one of the major opposed surfaces, the walls being substantially perpendicular to that major surface, and
disposing a radioactive source within each cavity, the radioactive source being one selected from the group consisting of a gamma emitter, a beta emiter and an x-ray emitter.

17. The process of claim 16 wherein
each cavity is defined by walls extending between, and terminating in, the two major opposed surfaces.

18. The process of claim 17 wherein
the semiconductor material is silicon of N-type conductivity, and
the dopant material is aluminum.

19. The process of claim 9 including
providing at least one planar electrical isolation region in the body to divide the body into at least two separate regions electrically isolated from each other and including an atomic battery in at least one of the electrically isolated regions,
forming each planar electrical isolation region in situ by the migration of a wire-like melt of a metalrich semiconductor material of the body, which is oriented substantially parallel with a second preferred crystal axis of the material of the body, by thermal gradient zone melting processing at a predetermined elevated temperature along a thermal gradient substantially parallel with the vertical axis of the body and the first axis of the crystal structure of the material of the body thereby producing recrystallized semiconductor material of the body having a predetermined level of concentration of the metal of the melt therein as determined by the solid solubility limit of that metal in that semiconductor material at that predetermined elevated temperature of migration and the metal is distributed substantially uniformly throughout the entire region, the metal comprising at least one dopant impurity material to impart a predetermined type conductivity opposite to that type conductivity of the body and a predetermined level of resistivity to the recrystallized material of the region.

20. The process of claim 19 wherein
the semiconductor material is silicon of N-type conductivity, and
the dopant impurity material is aluminum.

21. The process of claim 19 wherein
an atomic battery is formed in at least one of the electrically isolated regions of material of the body,
at least one semiconductor device fabricated in another one of the electrically isolated regions of material of the body, and
electrical means connecting the at least one semiconductor device to the at least one atomic battery for providing electrical power to the device for functioning of the same.

22. The process of claim 9 wherein
providing a means for disposing a source of radioactive material within each atomic battery includes
migrating a layer of vapor deposited material, which includes a gamma emitter material, by temperature gradient zone melting processing through the material of the body from the surface of preferred crystal planar orientation. to a depth less than the thickness of the body and solidifying the melt within the body at that predetermined depth to provide the radioactive source material for the battery.

23. The process of claim 22 wherein
the material of each gamma ray emitter is one selected from the group consisting of Barium 133, Cadmium 109, Calcium 45, Cerium 139 and Chromium 51.

24. The process of claim 22 wherein
the material of each gamma ray emitter is one selected from the group consisting of Cobalt 57, Dyaprosium 159, Gold 195, Iodine 125 and Iodine 129.

25. The process of claim 22 wherein
the material of each gamma ray emitter is one selected from the group consisting of Iron 55, Mercury 197, Mercury 203, Nickel 59 and Promethium 147.

26. The process of claim 22 wherein
the material of each gamma ray emitter is one selected from the group consisting of Selenium 75, Thulium 171, Tin 119, Tungsten 181 and Ytterbrium 169.

27. The process of claim 9 wherein
each region of recrystallized material is a planar region, each region is formed by the migration of a wire-like melt, which is oriented substantially parallel with a second preferred crystal axis of the material of the body, through the body by thermal gradient zone melting to form a lamellar structure of regions of alternate and opposite type conductivity and a P-N junction therebetween at the contiguous surfaces of the material of opposite type conductivity.

28. The process of claim 27 wherein
the preferred crystal planar orientation is (100),
the first crystal axis is $<100>$, and
the second crystal axis is one selected from the group consisting of $<011>$ and $<0\bar{1}1>$.

29. The process of claim 28 wherein
the semiconductor material is silicon of N-type conductivity, and
the dopant impurity material in aluminum.

30. The process of claim 29 wherein
the metal migrated through the body includes a radioactive material which functions as an emitter of rays which is one selected from the group consisting of gamma rays and x-rays to function as the radioactive source in the atomic battery.

31. The process of claim 27 wherein
the preferred crystal planar orientation is (110),
the first preferred crystal axis is $<110>$, and
the second preferred crystal axis is $<1\bar{1}0>$.

32. The process of claim 31 wherein
the semiconductor material is silicon, and
the dopant impurity material is aluminum.

33. The process of claim 32 wherein
the metal migrated through the body includes a radioactive material which functions as an emitter of rays which is one selected from the group consisting of gamma rays and x-rays to function as the radioactive source in the atomic battery.

34. The process of claim 27 wherein
the preferred crystal planar orientation is (111), and
the first preferred crystal axis $<111>$.

35. The process of claim 34 wherein
the second preferred crystal axis is one selected from the group consisting of $<0\bar{1}1>$, $<10\bar{1}>$, $<\bar{1}10>$, $<11\bar{2}>$, $<\bar{2}11>$ and $<1\bar{2}1>$.

36. The process of claim 35 wherein
the semiconductor material is silicon, and
the dopant impurity material is aluminum.

37. The process of claim 35 wherein
the metal migrated through the body includes a radioactive material which functions as an emitter of rays which is on selected from the group consisting of gamma rays and x-rays to function as the radioactive source in the atomic battery.

38. The process of claim 27 wherein
the metal migrated through the body includes a radioactive material which functions as an emitter of rays which is one selected from the group consisting of gamma rays and x-rays to function as the radioactive source in the atomic battery.

* * * * *